United States Patent [19]

Mueller

[11] 4,140,922

[45] Feb. 20, 1979

[54] AMPLIFIER STAGE FOR THE CURRENT SUPPLY OF I²L CIRCUITS

[75] Inventor: Ruediger Mueller, Munich, Fed. Rep. of Germany

[73] Assignee: Siemens Aktiengesellschaft, Berlin & Munich, Fed. Rep. of Germany

[21] Appl. No.: 800,655

[22] Filed: May 26, 1977

[30] Foreign Application Priority Data

Jun. 1, 1976 [DE] Fed. Rep. of Germany ....... 2624547

[51] Int. Cl.² .................... H03K 19/08; H01L 27/04
[52] U.S. Cl. .................................. 307/213; 307/203;
307/264; 307/303; 357/92
[58] Field of Search ................ 307/203, 43, 214, 264,
307/299 R, 299 A, 299 B, 303; 357/92

[56] References Cited

U.S. PATENT DOCUMENTS

| | | | |
|---|---|---|---|
| 4,007,385 | 2/1977 | Chapron | 307/299 B X |
| 4,013,901 | 3/1977 | Williams | 357/92 X |
| 4,035,664 | 7/1977 | Berger et al. | 357/92 X |
| 4,065,680 | 12/1977 | Russell | 307/303 X |

OTHER PUBLICATIONS

Müller, "Current Hogging Injection Logic-A New Logic with High Functional Density"; IEEE-JSSC; vol. SC-10, No. 5, pp. 348-352, 10/75.

Lehning, "Current Hogging Logic (CHL)-A New Bipolar Logic for LSI"; IEEE-JSSC; vol. SC-9, No. 5, pp. 228-233, 10/74.

Weider et al., "Computer-Aided Device Modeling and Design Procedure for CHL"; IEEE-JSSC; vol. SC-10, No. 5, pp. 352-359, 10/75.

Hart et al., "Bipolar LSI Takes a New Direction with Integrated Injection Logic"; Electronics (pub.), pp. 111-118, 10/3/74.

*Primary Examiner*—Larry N. Anagnos
*Attorney, Agent, or Firm*—Hill, Gross, Simpson, Van Santen, Steadman, Chiara & Simpson

[57] ABSTRACT

An amplifier stage is provided for supplying differing currents to integrated injection logic I²L circuits. The amplifier stage has a current hogging injection logic input CHIL gate, at least one further gate, and a CHIL output gate. Each of the gates has an injecting emitter, an output and an input. First I²L circuits connected to a first injector path connect with the input of the CHIL input gate. Second I²L circuits having a second injector path connect with an output of the CHIL output gate. The gate provided between the input and output CHIL gates is provided as a single I²L gate, dual I²L gates, or the combination of an I²L gate and a CHIL gate.

9 Claims, 4 Drawing Figures

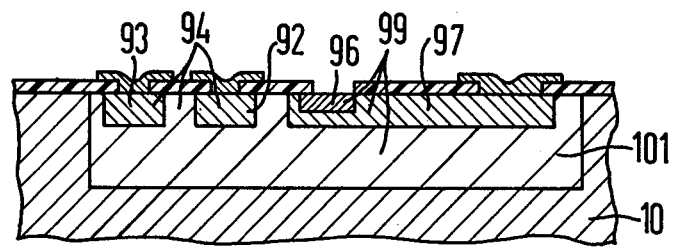
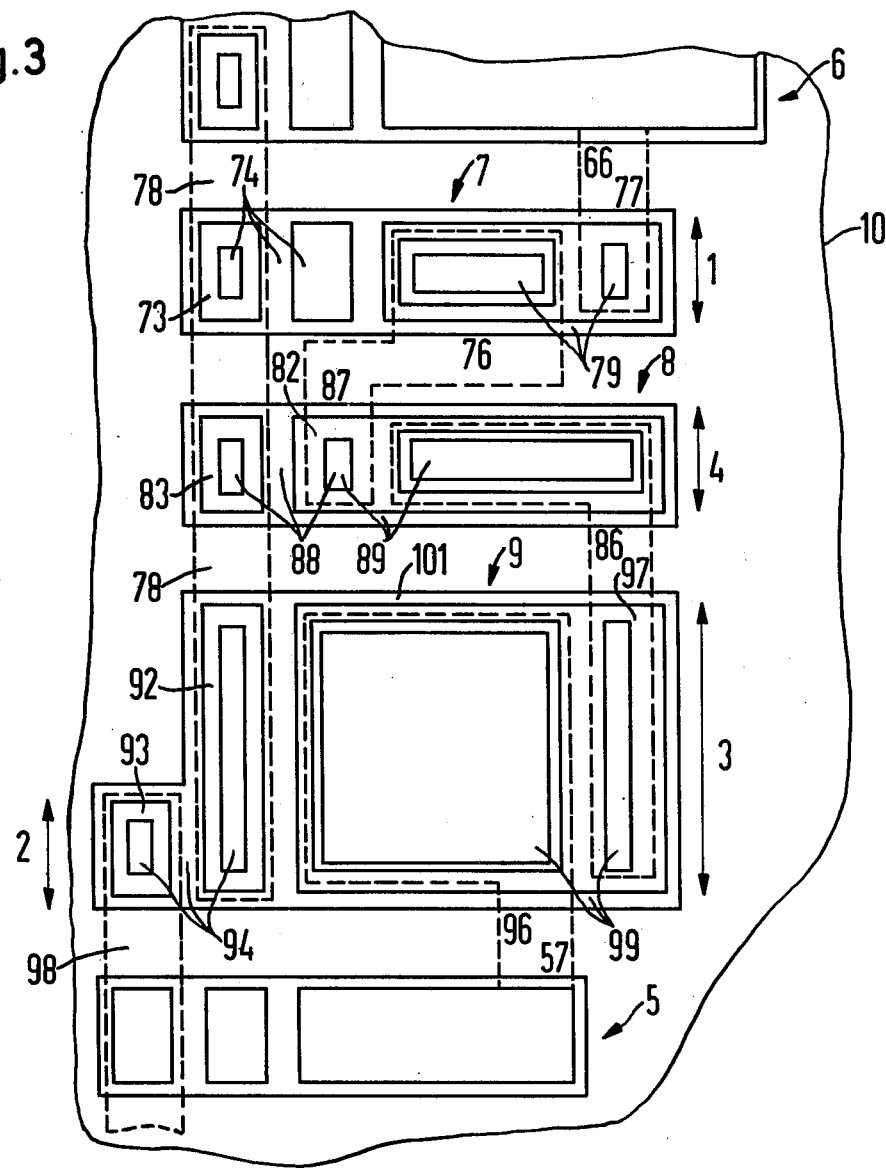

AMPLIFIER STAGE FOR THE CURRENT SUPPLY OF I²L CIRCUITS

BACKGROUND OF THE INVENTION

1. Field of the Invention

The invention relates to an amplifier stage for the current supply of I²L circuits with different circuits.

2. Description of the Prior Art

I²L logic circuits (integrated injection logic) are known. For example, I²L circuits of this type are described in the publication "Integrated Injection Logic: A new approach to LSI", K. H. Hart and A. Slob, IEEE Journal of Solid-State-Circuits, Vol. SC-7, October 1972, pages 346 to 351. If a plurality of such I²L circuits are arranged on one chip, it may be necessary to connect the output of an I²L gate, into which a low current is fed, to the input of another I²L gate which is operated with a higher current. In this situation, amplifier stages are required. This publication by C. M. Hart et al, "Bipolar LSI takes a new direction with integrated injection logic", Electronics, 3rd October 1974, pages 111 to 118, describes amplifier stages of this kind wherein the amplification is effected by enlarging the geometry.

SUMMARY OF THE INVENTION

An object of the present invention consists in providing an amplifier stage for the current amplification of I²L circuits with the aid of which amplifications of several decimal powers can be achieved with a low space requirement.

This object is realized by an amplifier stage having a current hogging injection logic (CHIL) input gate, at least one further gate, and a CHIL output gate. The CHIL input gate and the further gate are connected by their injecting emitters to a first injector path connecting first I²L circuits. The CHIL output gate is connected by its injecting emitter to a second injector path formed of second I²circuits and by its input to the first injector path. The output of the CHIL input gate is connected to the input of the further gate and the output of the further gate is connected to the input of the CHIL output gate. The current of the output of one of the first I²L gates is amplified in step fashion via the CHIL input gate, the further gate, and the CHIL output gate of the amplifier.

An essential advantage of the invention is that the degree of the amplification can be set by lay-out modifications.

BRIEF DESCRIPTION OF THE DRAWINGS

FIG. 2 schematically illustrates a cross-section through a CHIL-gate used in the invention; and FIG. 3 is a plan view of an integrated circuit layout corresponding to FIG. 1.

DESCRIPTION OF THE PREFERRED EMBODIMENTS

The following considerations led to the invention. The use of so-called CHIL circuits (current hogging injection logic) as intermediate gates in the amplifier stages produces an additional variation possibility for coupling the stages, and thus of influencing the overall current amplification of the amplifier stage.

Figure 1:
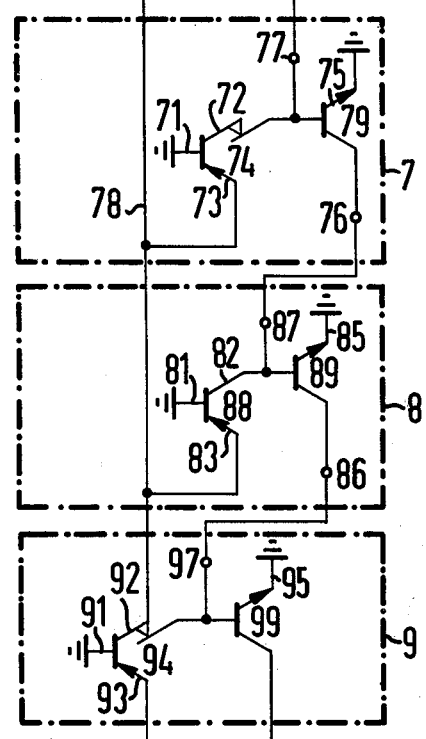
FIG. 1 is the circuit diagram of an amplifier arrangement corresponding to the invention.

FIG. 1 schematically illustrates the circuit diagram of an arrangement comprising I²L circuits and CHIL gates. For example, as described in my copending application Ser. No. 800,633, filed May 26, 1977, the injector path 98 is connected to I²L gates of higher current consumption, which have not been illustrated in FIG. 1. The injector path 98 is connected to an injecting emitter 93 of a CHIL arrangement 9. An input of the CHIL arrangement is connected to a further injector path 78.

CHIL arrangements are described, for example, in the IEEE Journal of Solid-State Circuits, Vol. SC-10, No. 5, October, 1975. The CHIL arrangement 9 has the injecting emitter 93, at least two inputs 92 and 97, and at least one output 96. FIG. 2 shows a schematic cross-section through a CHIL arrangement 9 of this type, wherein details which have already been described in association with FIG. 1 are referenced accordingly.

The function of the CHIL arrangement 9 will now be briefly described. For example, this arrangement consists of the lateral pnp transistor 94 and the vertical npn transistor 99. The injecting emitter 93 is supplied with a current via the injector path 98. As a result, minority carriers emanating from the emitter are injected into the epitaxial layer 101. If the diffusion length of these minority carriers is considerably greater than the distance between the injector diffusion zone 93 and the input diffusion zone 92, most of the minority charge carriers will reach the input diffusion zone 92 and supply the latter, together with the associated injector path 78, with current. When the input diffusion zone 92 and the associated injector path 78 have become charged, then minority charge carriers flow from there to the base diffusion zone 97 of the vertical transistor 99, or to further input diffusion zones arranged therebetween. The output diffusion zone 96 is arranged in the diffusion zone 97. In addition to the output diffusion zone 96, further output diffusion zones can also be provided. These represent multiple-collectors of the vertical transistor 99. The zone 10 represents the emitter of the vertical transistor 99 and the base terminal of the lateral transistor 94.

The amplifier stage is arranged in the n+ (or p+) doped silicon layer 10 and the n (or p) conducting epitaxial layer 101 arranged on the silicon layer 10. The epitaxial layer 101 is divided into individual troughs in which the gates of the stage are arranged.

As can be seen from FIG. 1, the injector path 78, in which a lower current flows than in the injector path 98, can, for example, be connected to the injecting emitter 63 of a CHIL arrangement 6. The injector path 68, which is connected to the input 62 of the CHIL arrangement 6, then carries a lower current than the injector path 78.

If stages having a higher injector current, for example, stages which are connected to the injector path 98, are now to be operated by gates having a lower injector current, current amplifiers are required. In FIG. 1, for example, the gate 5 which is connected to the injector path 98 having the higher injector current, is to be operated by the gate 6 which is connected to the injector path 68. For this purpose, an amplifier stage corresponding to the invention is provided which consists of the CHIL input gate 7, a further gate 8, preferably an I²L gate, and the CHIL output gate 9. These three gates are connected to the injector path 78. The construction of the CHIL input gate 7 is identical to that of the CHIL output gate 9 already described. The I²L gate 8 preferably consists of the lateral pnp transistor 88 and the vertical npn transistor 89. The input of the gate is referenced 87. The output is referenced 86. Instead of one output 87, a plurality of outputs can also be provided in known manner. The injector of the I²L gate 8, which is connected to the injector path 78, is referenced 83.

The output 66 of the CHIL gate 6, which in the example is to operate the input 57 of the CHIL gate 5, is connected to the input 77 of the CHIL input gate 7 of the amplifier stage. The output 76 of this CHIL input gate 7 is connected to the input 87 of the I²L gate. The output 86 of this I²L gate 8 is connected to the input 97 of the further CHIL output gate 9, which has already been described in detail above. The output 96 of this gate is finally connected to the input 57 of the gate 5. The amplifier stage corresponding to the invention serves to amplify the current of the output 66 of the gate 6 in stepped fashion via the gates 7, 8 and 9. The amplification between the CHIL gate 7 and the I²L gate 8 amounts to 1/A. In this formula, A signifies the coupling factor which corresponds approximately to the current amplification of the lateral pnp transistor of the CHIL gates between the input injector thereof and the input. Here, saturation effects are neglected. By varying the widths, 1, 3 and 4 of the CHIL gates 7, 8 and 9 and the number of the connected gates, it is possible to modify the current I. It is likewise possible to vary the amplification by modifying the overlap 2 between the injecting emitter 93 and the input 92.

The overall amplification is then $(I_{57}/I_{66}) = (m/A)$. The factor m is calculated from the sum of all the widths of the injecting emitters which are connected to the injector path 78, divided by the width 1 of the CHIL gate 7 times the width of the overlap 2.

In the example shown in FIG. 3, $m = 6/1$, where the width of the injecting emitters 73 and 83 and the width of the injecting emitter of the gate 7 correspond to one length unit. The width of the CHIL gate 9 corresponds to the width of 3 length units. The width of the overlap 2 corresponds to one length unit. The overall amplification thus amounts to $(I_{57}/I_{66}) = 6/A$.

By employing amplifier stages corresponding to the invention in association with I²L gates of arbitrary design, stages exhibiting higher injection current can be operated by gates exhibiting low injection current in that the output of a gate exhibiting the lower injector current is connected to the input of an amplifier stage corresponding to the invention, and the output of the amplifier stage corresponding to the invention is connected to the input of the gate exhibiting the higher injector current.

Figure 1A:
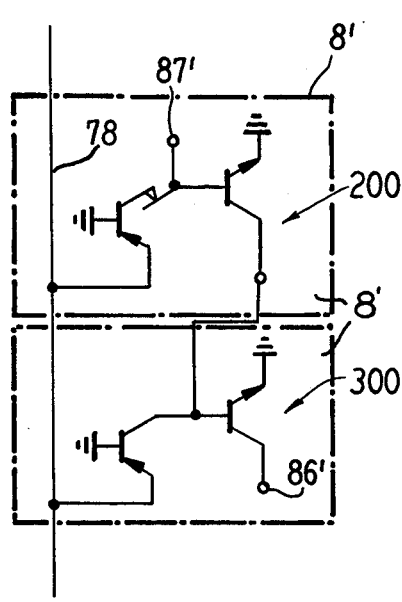
FIG. 1A is an alternate embodiment of a gate in the amplifier of FIG. 1.

The gate 8 can also, for example, be embodied as a gate 8', shown in FIG. 1A and consist of at least one I²L gate (not shown) of at least one CHIL gate 200 and at least one I²L gate 300, where the output of one gate is in each case connected to the input of the next one of these gates. All the injecting emitters of the gate 8 are connected to the injector path 78.

The amplifier stage corresponding to the invention is advantageously arranged in a n⁺ doped silicon layer 10, and a n conducting, epitaxial layer 101 arranged thereupon. Here, the epitaxial layer 101 is divided, for example, by separating diffusion processes, into individual troughs in which the individual gates are arranged.

Although various minor modifications may be suggested by those versed in the art, it should be understood that I wish to embody within the scope of the patent warranted hereon, all such embodiments as reasonably and properly come within the scope of my contribution to the art.

I claim as my invention:

1. An amplifier stage for supplying integrated injection logic (I²L) circuit with differing currents, said I²L circuits including a first I²L circuit having a first transistor with an injecting emitter and connected via said injecting emitter to a first injector path, a further I²L circuit having a first transistor with an injecting emitter connected via said injecting emitter to a further injector path, and differing currents flowing in the first and further injector paths, wherein said amplifier stage comprises:

a current hogging injection logic (CHIL) input gate having a transistor with an injecting emitter, an output, and an input;

at least one gate having a transistor with an injecting emitter, an output, and an input, a CHIL output gate having a transistor with an injecting emitter, an output, and an input;

the CHIL input gate input being connected to an output of the first I²L circuit and the CHIL output gate output being connected to an input of the further I²L circuit;

the CHIL input gate and said at least one gate being connected by their injecting emitters to the first injector path;

the CHIL output gate injecting emitter being connected to the further injector path and by its input coupled to the first injector path;

the CHIL input gate output being connected to the input of the at least one gate; amd the at least one gate output being conneced to the input of the CHIL output gate;

whereby the current at the output of the first I²L circuit is amplified in stepped fashion via the CHIL input gate, the at least one gate, and the CHIL output gate.

2. An amplifier stage as claimed in claim 1, characterized in that the at last one gate comprises at least one I²L gate.

3. An amplifier stage as claimed in claim 1, characterized in that the at least one gate comprises at least one CHIL gate having an output and at least one I²L gate having an input connecting to the output of the at least one CHIL gate.

4. An amplifier stage as claimed in claim 1, characterized in that the CHIL input gate and the CHIL output gate each comprise a lateral pnp transistor and a vertical npn transistor, a collector of the lateral transistor connecting to a base of the vertical transistor and to the respective circuit input.

5. An amplifier as claimed in claim 1, characterized in that the first and further I²L circuits consist of a lateral pnp transistor and a vertical npn transistor, a collector of the lateral transistor connecting to a base of the vertical transistor and to the respective circuit input.

6. An amplifier stage as claimed in claim 1, characterized in that the stage is arranged in a n⁺ doped silicon layer and a n conducting epitaxial layer arranged on the silicon layer, the epitaxial layer being divided into individual troughs in which the gates are arranged.

7. Stage as claimed in claim 1, characterized in that the current amplification of the amplifier stage is at least partially determined by the widths of the input gate, of the at least one gate, and of the output gate, and by the overlap of the injecting emitter of the output gate with the input of the output gate.

8. An amplifier stage of claim 1 in which the stage is arranged on a p$^+$ doped silicon layer and a p conducting epitaxial layer, the epitaxial layer being divided into individual troughs in which the gates are arranged.

9. An arrangement in which integrated injection (I$^2$L) circuits are supplied with differing currents, comprising:
(a) a first I$^2$L circuit having a transistor with an injecting emitter and connected via said injecting emitter to a first injector path;
(b) a further I$^2$L circuit having a transistor with an injecting emitter connected via said injecting emitter to a further injector path;
(c) differing currents flowing in the first and further injector paths;
(d) an amplifier stage including
  (i) a current hogging injection logic (CHIL) input gate having a transistor with an injecting emitter, an output, and an input;
  (ii) at least one gate having a transistor with an injecting emitter, an output, and an input;
  (iii) a CHIL output gate having a transistor with an injecting emitter, an output, and an input;
(e) the CHIL input gate input being connected to an output of the first I$^2$circuit and the CHIL output gate output being connected to an input of the further I$^2$L circuit;
(f) the CHIL input gate injecting emitter being connected to the first injector path;
(g) the CHIL output gate injecting emitter being connected to the further injector path and by its input coupled to the first injector path;
(h) the CHIL input gate output being connected to the input of the at least one gate; and
(i) the at least one gate output being connected to the input of the CHIL output gate;
whereby the current at the output of the first I$^2$L circuit is amplified in steped fashion via the CHIL input gate, the at least one gate, and the CHIL output gate.

* * * * *